(12) United States Patent
Nakazawa

(10) Patent No.: US 8,659,114 B2
(45) Date of Patent: Feb. 25, 2014

(54) SEMICONDUCTOR DEVICE

(75) Inventor: Keisuke Nakazawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/309,730

(22) Filed: Dec. 2, 2011

(65) Prior Publication Data

US 2012/0286346 A1   Nov. 15, 2012

(30) Foreign Application Priority Data

May 9, 2011   (JP) ................. 2011-104407

(51) Int. Cl.
*H01L 21/70* (2006.01)
*H01L 21/31* (2006.01)

(52) U.S. Cl.
USPC .............. 257/506; 257/E29.02; 257/E29.3; 257/E29.264; 438/780

(58) Field of Classification Search
USPC ............. 257/316, 596, 365, E29.02, E29.3, 257/E29.264, 501, 506, E29.018
See application file for complete search history.

(56) References Cited

U.S. PATENT DOCUMENTS

| | | | |
|---|---|---|---|
| 6,706,646 B1 | 3/2004 | Lee et al. | |
| 7,407,864 B2 | 8/2008 | Kawasaki et al. | |
| 7,781,341 B2 | 8/2010 | Nakazawa | |
| 2004/0072408 A1* | 4/2004 | Yun et al. | 438/435 |
| 2005/0093042 A1 | 5/2005 | Nakazawa et al. | |
| 2006/0125372 A1* | 6/2006 | Tanaka et al. | 313/473 |
| 2006/0205165 A1* | 9/2006 | Kawasaki et al. | 438/296 |
| 2008/0090988 A1 | 4/2008 | Nakazawa et al. | |
| 2010/0015778 A1* | 1/2010 | Lin et al. | 438/443 |
| 2010/0190317 A1 | 7/2010 | Iwasawa et al. | |
| 2010/0311220 A1 | 12/2010 | Matsuo et al. | |

FOREIGN PATENT DOCUMENTS

| | | |
|---|---|---|
| JP | 7-27896 | 3/1995 |
| JP | 2002-3783 | 1/2002 |
| JP | 2005-350284 | 12/2005 |
| JP | 2006-291107 | 10/2006 |
| JP | 4176523 | 8/2008 |

* cited by examiner

*Primary Examiner* — Nikolay Yushin
(74) *Attorney, Agent, or Firm* — Finnegan, Henderson, Farabow, Garrett & Dunner, L.L.P.

(57) ABSTRACT

According to one embodiment, a semiconductor device includes a semiconductor substrate, a trench formed in an element isolating area of the semiconductor substrate, and a silicon oxide film that is embedded in the trench and contains an alkali metal element or alkali earth metal element.

16 Claims, 6 Drawing Sheets

FIG.3

| ELE-MENT | SPE-CIES | ATOMIC RADIUS (Å) | IONIC RADIUS (Å) | Ea(M⁺) (eV) | Ea(M⁰) (eV) |
|---|---|---|---|---|---|
| Na | 1 | 1.86 | 1.13 | 1.64 | 1.37 |
| K | 1 | 2.31 | 1.52 | 2.06 | 1.87 |
| Rb | 1 | 2.47 | 1.66 | 2.82 | 1.51 |
| Cs | 1 | 2.66 | 1.81 | 2.43 | 2.53 |
| Mg | 2 | 1.60 | 0.71 | 1.64 | 2.51 |
| Ca | 2 | 1.97 | 1.14 | 1.27 | 2.69 |
| Sr | 2 | 2.15 | 1.32 | 1.67 | 3.16 |
| Ba | 2 | 2.17 | 1.49 | 0.92 | 2.71 |

US 8,659,114 B2

SEMICONDUCTOR DEVICE

CROSS-REFERENCE TO RELATED APPLICATIONS

This application is based upon and claims the benefit of priority from Japanese Patent Application No. 2011-104407, filed on May 9, 2011; the entire contents of which are incorporated herein by reference.

FIELD

Embodiments described herein relate generally to a semiconductor device and a method of manufacturing a semiconductor device.

BACKGROUND

With the miniaturization of semiconductor integrated circuits, it has become difficult to embed an insulating film with a CVD method. In order to ensure the embedding performance of an insulating film, a method of embedding polysilazane using an application method has been under consideration. Polysilazne refers to a polymer having $SiH_2$—NH— as the basic structure, and can be transformed into a silicon oxide film when it is annealed in a water vapor atmosphere. Concerning the temperature of water vapor, a higher temperature gives a characteristic which is close to that of a silicon dioxide, and at the same time causes the side walls of Si to be easily oxidized, thereby bringing about the transformation of silicon. When the temperature of water vapor is low, the oxidation of the side walls of Si is suppressed, but the etching rate by an etchant increases. For this reason, it is difficult to obtain the desired shape.

BRIEF DESCRIPTION OF THE DRAWINGS

FIG. 3 is a table illustrating the activation energies of alkali metal elements and alkali earth metal elements applied to a semiconductor device according to the embodiments;

DETAILED DESCRIPTION

In general, according to one embodiment, a semiconductor device includes a semiconductor substrate, a trench, and a silicon oxide film. The trench is formed in an element isolating area of the semiconductor substrate. The silicon oxide film contains an alkali metal element or an alkali earth metal element therein and is embedded in the trench.

Exemplary embodiments of a semiconductor device will be explained below in detail with reference to the accompanying drawings. The present invention is not limited to the following embodiments.

First Embodiment

FIGS. 1A to 1E and FIGS. 2A to 2E are cross-sectional views illustrating a method of manufacturing a semiconductor device according to a first embodiment. In the first example, a NAND memory is described as an example of a semiconductor device.

Figure 1A:
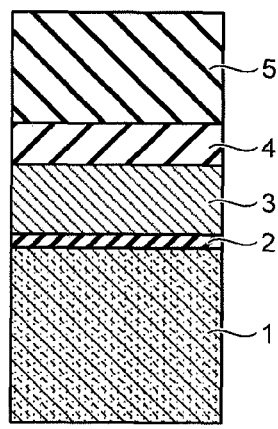
FIGS. 1A to 1E are cross-sectional views illustrating a method of manufacturing a semiconductor device according to a first embodiment.

In FIG. 1A, a gate insulating film 2 is formed on a semiconductor substrate 1 by a method, for example, oxidation. Si, Ge, SiGe, SiC, SiSn, PbS, GaAs, InP, InGaAsP, GaP, GaN, or ZnSe can be used as the material of the semiconductor substrate 1. As the gate insulating film 2, a silicon oxide film may be used, or a high dielectric film may be used. The thickness of the gate insulating film 2 may be set to, for example, about 8 nm.

Subsequently, a floating gate electrode film 3 is formed on the gate insulating film 2 by a method such as CVD. As the floating gate electrode film 3, a polycrystalline silicon film may be used, or a metal alloy film of, for example, WSi, CoSi, or the like may be used. The thickness of the floating gate metal electrode 3 may be set to be in the range of 100 to 200 nm.

Subsequently, a CMP stopper film 4 is formed on the floating gate electrode film 3 by a method such as low pressure CVD (LP CVD). As the CMP stopper film 4, a silicon nitride film may be used, or a polycrystalline silicon film may be used. The thickness of the CMP stopper film 4 may be set to be in the range of, for example, 100 to 200 nm.

Subsequently, a hard mask 5 is formed thereon by a method such as LP CVD. As the hard mask 5, a TEOS film, for example, may be used. The thickness of the hard mask 5 may be set to, for example, about 300 nm.

Figure 1B:
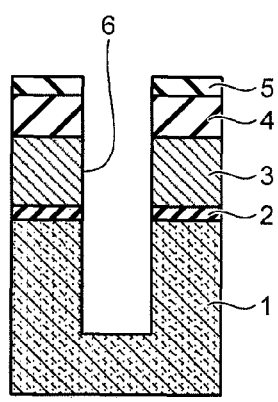

Subsequently, as illustrated in FIG. 1B, a trench 6 is formed in the element isolating area using photolithography technology and dry etching technology so that the trench 6 extends through the hard mask 5, the CMP stopper film 4, the floating gate electrode film 3, and the gate insulating film 2, and reaches the inside of the semiconductor substrate 1. At this time, the hard mask 5 becomes thinner, and thus the hard mask 5 slightly remains on the CMP stopper film 4. The trench 6 can be used as Shallow Trench Isolation (STI) in a NAND memory. The width of the trench 6 can be set to be within the range of about 10 to 100 nm, and the depth of the trench 6 can be set to be within the range of about 200 to 500 nm.

Figure 1C:
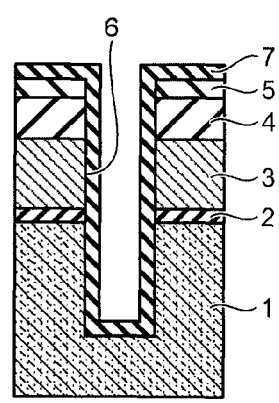

Subsequently, as illustrated in FIG. 1C, a liner film 7 is formed on the hard mask 5 to cover the side walls of the trench 6 by a method such as CVD or the like. As the liner film 7, a TEOS film or an HTO film can be used, for example. The liner film 7 may be configured not to contain an alkali metal element and an alkali earth metal element. The thickness of the linear film 7 may be set to be within the range of about 1 to 20 nm. Alternatively, the liner film 7 may not be formed.

Figure 1D:
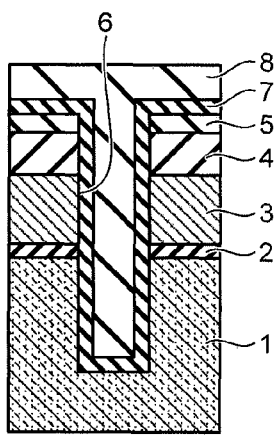

Subsequently, as illustrated in FIG. 1D, a silicon-containing inorganic polymer film 8 is formed on the liner film 7 to be embedded in the trench 6 by a method such as a coating method or the like. In this case, the silicon-containing inorganic polymer film 8 is formed to contain an alkali metal element or an alkali earth metal element. The alkali metal element or the alkali earth metal element is preferably selected from K, Rb, Cs, Mg, and Sr. Specifically, Cs is the most preferable element. These elements may be used singly, or a plurality of elements may be used in combination. The concentration of the alkali metal element or the alkali earth metal element is preferably set to $10^{10}$ atoms/cm$^2$ or more in terms of the surface concentration when it is formed into an oxide film on the semiconductor substrate 1.

The silicon-containing inorganic polymer film 8 can be configured using macromolecules having a Si—O bond or a Si—N bond as a basic structure. For example, as the silicon-containing inorganic polymer 8, a perhydropolysilazane (PHPS) film or a hydrogen silsesquioxane (HSQ) film can be used.

If a silicon-containing polymer film (organic SOG) having an organic substance, such as a methyl group, as an functional group is used instead of the PHPS film or the HSQ film, the organic substance begins to decompose at a temperature of about 400 to 600° C. Accordingly, such a film cannot be used in a portion which will be subjected to a manufacturing process performed at high temperatures. Especially in the STI, carbons in organic SOG serve as fixed charges, thereby negatively influencing a threshold value of a semiconductor device. Meanwhile, such an influence of the carbons can be reduced in the case of being contained in the silicon-containing inorganic polymer film (inorganic SOG).

The organic SOG has a low in electric breakdown voltage of about 5 MV/cm. The organic SOG cannot be used at portions (for example, STI or the like in a NAND memory) to which a high electric field of about 10 to 20 MV/cm is applied, and thus the inorganic SOG, which is higher in electric breakdown voltage than the organic SOG, is used at those portions.

As an example of a method of causing the silicon-containing inorganic polymer film 8 to contain the alkali metal element or the alkali earth metal element, there is a method in which the salt of the alkali metal element or the alkali earth metal element is added to a silicon-containing inorganic polymer solution and then the resultant solution is coated on the liner film 7. In this case, the concentration of the alkali metal element or the alkali earth metal element in the silicon-containing inorganic polymer solution is preferably set to $10^{10}$ atoms/cm$^2$ or more in terms of the surface concentration when it is formed into a film on a Si Substrate. Next, a silicon-containing inorganic polymer solution is applied and then subjected to thermal treatment so that the solvent is volatilized. As a result, the silicon-containing inorganic polymer film 8 can be formed. This thermal treatment can be performed by placing the thermal treatment target on the top surface of a hot plate, for several tens of seconds at a temperature, for example, in the range of about 80 to 300° C. Examples of an additive to the alkali metal element or the alkali earth metal element may include nitrates, sulfates, carbonates, oxides, chlorides, bromides, fluorides, iodides, and hydroxides of alkali metal elements or alkali earth metal elements.

Figure 1E:
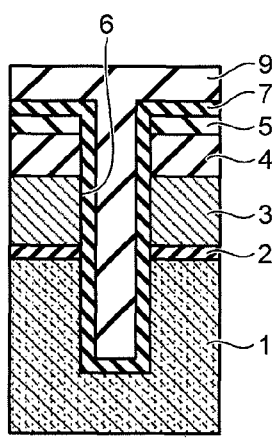

Next, as illustrated in FIG. 1E, the silicon-containing inorganic polymer film 8 is subjected to an oxidation process performed in a water-vapor-containing atmosphere, so that the silicon-containing inorganic polymer film 8 is converted into a silicon oxide film 9. Furthermore, the oxidation process is desirably performed at temperature of 230° C. or above and 900° C. or below. Here, when the temperature of the oxidation process is set to 230° C. or above, the silicon oxide film 9 can be densified. Because of this, the etching rate by an etchant such as hydrofluoric acid and the like may be reduced and hence the desired shape can be easily obtained. In addition, when the temperature of the oxidation process is set to 900° or below, the oxidation of the side wall of the semiconductor substrate 1 is suppressed and the transformation of the semiconductor substrate 1 can be suppressed. To stabilize the atmosphere and the temperature inside an oxidation furnace, it is preferable that the oxidation process is performed for 5 minutes or longer. However, if the oxidation is performed for an excessively long time, the oxidation produces an oxide film having a large thickness on the side wall of the semiconductor substrate 1. Accordingly, it is desirable that the time for the oxidation process is set to 60 minutes or shorter.

In this case, since the silicon-containing inorganic polymer film 8 is caused to contain an alkali metal element or an alkali earth metal element, a reaction for converting the silicon-containing inorganic polymer film 8 into the silicon oxide film 9 can be promoted. Because of this, even while the temperature of the oxidation process of the silicon-containing inorganic polymer film 8 is lowered, the silicon oxide film 9 is allowed to have the film quality, such as the concentration of an element, a density, or the like, which is close to that of a silicon dioxide. Furthermore, not only the transformation of the semiconductor substrate 1 can be prevented but also the embedding of the silicon oxide film 9 in the trench 6 can be ensured and the etching resistance can be improved.

In addition, thanks to the liner film 7 disposed between the trench 6 and the silicon oxide film 9, the diffusion of the alkali metal element or the alkali earth metal element into the semiconductor substrate 1 and the gate insulating film 2 can be inhibited even though the silicon-contained inorganic polymer film 8 contains the alkali metal element or the alkali earth metal element. For this reason, it is possible to inhibit the alkali metal element or the alkali earth metal element from acting as fixed charges in the semiconductor substrate 1 or the gate insulating film 2, and it is possible to inhibit the lowering of the reliability of the device that is likely to occur due to the use of silicon oxide film 9.

Figure 2A:
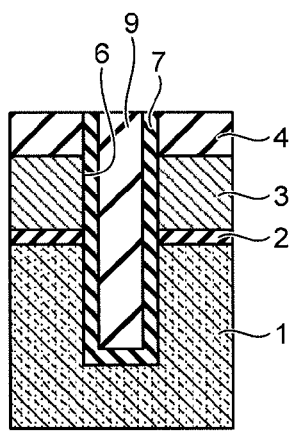
FIGS. 2A to 2E are cross-sectional views illustrating a method of manufacturing a semiconductor device according to the first embodiment.

Subsequently, as illustrated in FIG. 2A, the silicon oxide film 9, the liner film 7, and the hard mask 5 are thinned by a method such as CMP or the like until the CMP stopper film 4 is exposed. This process removes the silicon oxide film 9, the liner film 7, and the hard mask 5 formed around the trench 6.

Before or after performing this CMP, the silicon oxide film 9 may be thermal-treated in an inert gas atmosphere. This thermal treatment is preferably performed at a temperature of 700° C. or above and 1100° C. or below. Setting the temperature of the thermal treatment to 700° C. or above allows sufficient densification of the silicon oxide film 9. On the other hand, setting the temperature of the thermal treatment to 1100° C. or below allows the suppression of an increase in the diffusion depth of a channel layer which is formed in advance through an ion implantation process depending on the types of devices. With this thermal treatment, moisture is removed from the silicon oxide film 9, which may lead to the densification of the silicon oxide film 9 and to the improvement in the electrical characteristics of a device.

Figure 2B:
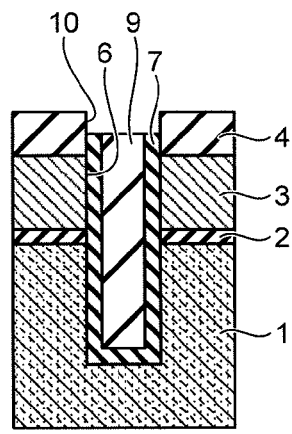

Subsequently, as illustrated in FIG. 2B, upper portions of the silicon oxide film 9 and the liner film 7 are removed by dry etching using a fluoride or wet etching using a dilute hydrofluoric acid, which forms a step 10 with respect to the CMP stopper film 4.

Figure 2C:
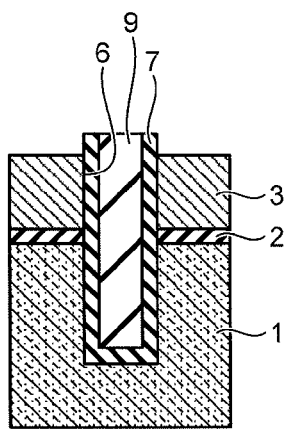

Subsequently, as illustrated in FIG. 2C, the CMP stopper film 4 is removed by wet etching using a phosphoric acid solution so that a floating gate electrode film 3 is exposed.

Figure 2D:
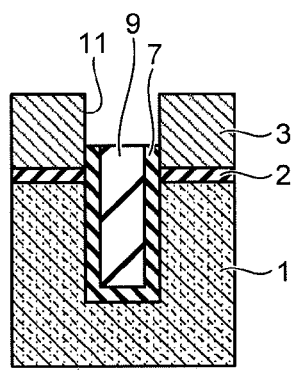

Subsequently, as illustrated in FIG. 2D, the upper portions of the silicon oxide film 9 and the liner film 7 are removed by dry etching using a fluoride or wet etching using a dilute hydrofluoric acid, which forms a step 11 with respect to the floating gate electrode film 3. In this case, the silicon oxide film 9 and the liner film 7 preferably protrude from the upper surface of the gate insulating film 2.

Herein, since the silicon-containing inorganic polymer film 8 is configured to contain an alkali metal element or an alkali earth metal element, the speed of the conversion from the silicon-containing inorganic polymer film 8 to the silicon oxide film 9 can be improved, the film quality such as the composition of elements or the density can be close to that of the silicon dioxide. Because of this, the etching rate of the silicon oxide film 9 can be adjusted to be equal to that of the liner film 7. This prevents the silicon oxide film 9 from being excessively etched as compared with the liner film 7 when the upper portions of the silicon oxide film 9 and liner film 7 are removed, and also equalizes the height of the liner film 7 and the silicon oxide film 9. The difference in height between the liner film 7 and the silicon oxide film 9 is preferably set to 10 nm or less.

Figure 2E:
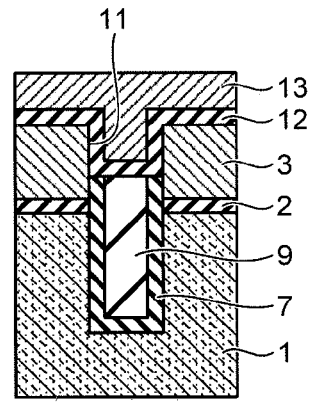

Next, as illustrated in FIG. 2E, an inter-electrode insulating film 12 is formed on the floating gate electrode film 3, the liner film 7, and the silicon oxide film 9 by a method such as CVD or the like to cover the stair rise portion (side wall) of the step 11. Furthermore, as the inter-electrode insulating film 12, an ONO film—silicon oxide film/silicon nitride film/silicon oxide film—may be used, for example. The thickness of the inter-electrode insulating film 12 may be set to, for example, about 20 nm.

Next, a control gate electrode film 13 is formed on the inter-electrode insulating film 12 by a method such as CVD or the like. As the control gate electrode film 13, for example, a polycrystalline silicon film and a tungsten film may be used. The thickness of the control gate film 13 may be set to, for example, about 50 nm.

FIG. 3 is a table illustrating the activation energies of alkali metal elements and alkali earth metal elements applied to semiconductor devices according to the embodiments. $Ea(M^+)$ and $Ea(M^0)$ respectively represent activation energies (calculated values) at the time of causing a univalent ion and a neutral atom to migrate in a silicon lattice. As to each of $Ea(M^+)$ and $Ea(M^0)$, each being an activation energy, elements having an activation energy of 1.5 eV or higher are hatched in bright and elements having an activation energy of 2.0 eV or higher are hatched in dark.

In FIG. 3, in regard to alkali metal elements, as an atomic radius or an ionic radius becomes larger, the activation energy Ea becomes higher and thus diffusion of such elements requires more energy. In regard to alkali earth metal elements, it is known that there is a tendency in which the activation energy $Ea(M^0)$ is generally high as compared to alkali metals but the activation energy $Ea(M^+)$ is low.

Figure 4A:
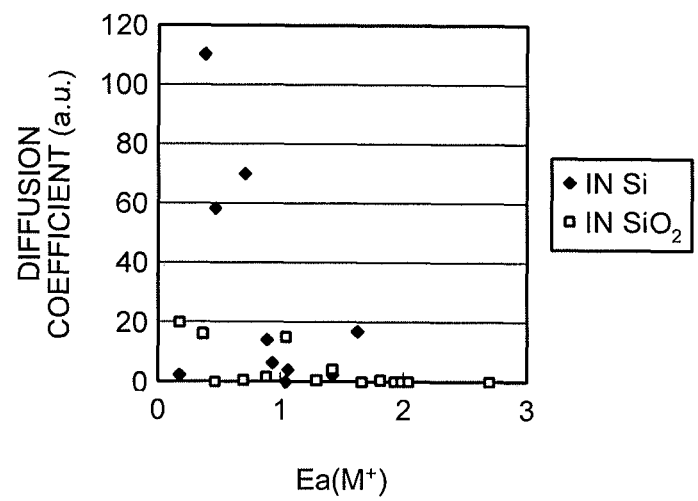
FIG. 4A is a graph illustrating the relation between the activation energy and the diffusion coefficient of univalent ions of alkali metal elements and alkali earth metal elements.
Figure 4B:
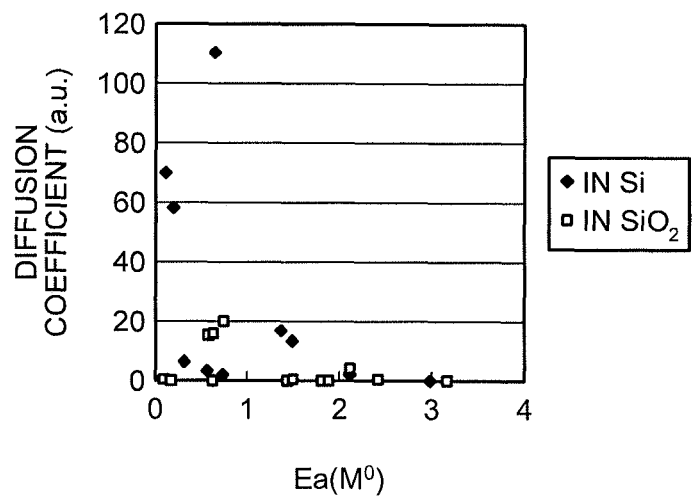
FIG. 4B is a graph illustrating the relation between the activation energy and the diffusion coefficient of neutral atoms of alkali metal elements and alkali earth metal elements.

FIG. 4A is a graph illustrating the relation between the activation energy and the diffusion coefficient of univalent ions of alkali metal elements and alkali earth metal elements, and FIG. 4B is a graph illustrating the relation between the activation energy and the diffusion coefficient of neutral atoms of alkali metal elements and alkali earth metal elements. Furthermore, these illustrate the relation between the activation energy and the diffusion coefficients (calculated values) inside a silicon atom and a silicon oxide film.

In FIG. 4, it can be seen that as the activation energies $Ea(M^+)$ and $Ea(M^0)$ become smaller, the diffusion coefficients increase. In regard to elements that are difficult to diffuse, their activation energies $Ea(M^+)$ and $Ea(M^0)$ both are 1.5 eV or more, specifically 2.0 eV or more on the safe side. As the elements whose both activation energies, $Ea(M^+)$ and $Ea(M^0)$, are 1.5 eV or more, there are five elements—K, Rb, Cs, Mg, and Sr. Specifically, Cs is about 2.5 eV in both of the activation energies, $Ea(M^+)$ and $Ea(M^0)$, and hence is an element which is very difficult to diffuse.

Alkali metal elements or alkali earth metal elements are used as a catalyst that promotes a reaction in manufacturing a glass using a sol-gel method. Low-temperature fluidity of these elements can be improved by lowering the glass transition temperature. An addition of these elements to a chemical solution for formation of a silicon oxide thin film can promote the formation of a thin film, improve fluidity, and reduce the crystal transformation of a Si substrate caused by contraction and stress of the silicon oxide film 9 in the process of a thermal treatment.

An application liquid that contains an alkali metal element or an alkali earth metal element can promote a reaction for conversion to an oxide and enables an inorganic SOG film to have the film quality, such as the element composition or density, which is close to that of CVD oxide films. Accordingly, the etching rate of the inorganic SOG film may be adjusted to be almost equal to the etching rate of the CVD oxide films so that the heights of the liner film 7 and the silicon oxide film 9 can be equalized.

Second Embodiment

FIG. 5A to FIG. 5E are cross-sectional views illustrating a method of manufacturing a semiconductor device according to a second embodiment. In the second embodiment, a fin type semiconductor device is described as an example.

Figure 5A:
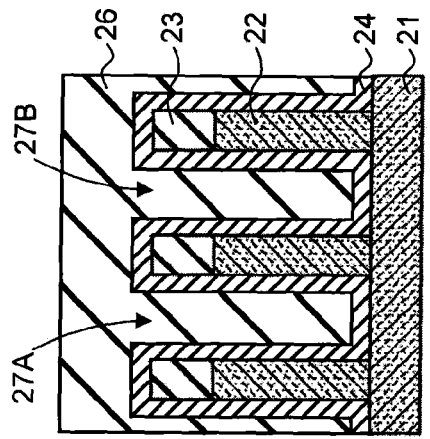
FIGS. 5A to 5E are cross-sectional views illustrating a method of manufacturing a semiconductor device according to a second embodiment.

In FIG. 5A, a CMP stopper film 23 is formed on the semiconductor substrate 21 by a method such as CVD or the like. A semiconductor substrate 21 may be thermal-treated in an oxygen atmosphere before the CMP stopper film 23 is formed on a semiconductor substrate 21 so that an oxide film is formed on the semiconductor substrate 21. The thickness of the CMP stopper film 23 may be set to, for example, about 100 to 200 nm.

After that, trenches 27A, 27B that pass through the CMP stopper film 23 and arrive at inner portions of the semiconductor substrate 21 are formed using photolithography technology and dry etching technology. This forms a fin 22 formed on the semiconductor substrate 21. The height of the fin 22 may be set to be within the range of 100 to 300 nm. The width of the fin 22 may be set to 50 nm or narrower.

Figure 5B:
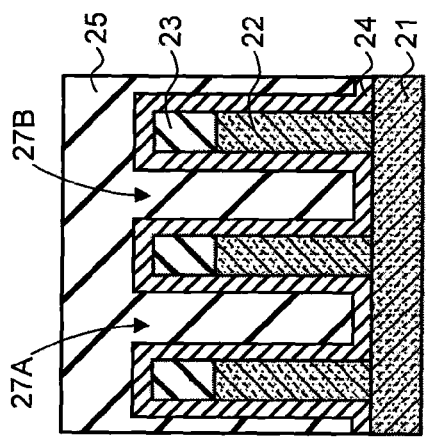

Next, as illustrated in FIG. 5B, a liner film 24 is formed on the semiconductor substrate 21 by a method such as CVD or the like to cover the fin 22 and the CMP stopper film 23.
As the liner film 24, a TEOS film or an HTO film, for example, may be used. The liner film 24 can be configured contain neither an alkali metal element nor an alkali earth metal element. The thickness of the liner film 24 may be set to be within the range of about 2 to 30 nm. Alternatively, the liner film 24 may not be included.

Next, a silicon-containing inorganic polymer film 25 is formed on the liner film 24 by a method such as a coating method or the like in a manner such that the vicinity of the fin 22 is planarized. In this case, the silicon-containing inorganic polymer film 25 is configured to contain an alkali metal element or an alkali earth metal element. The silicon-containing inorganic polymer film 25 and the silicon-containing inorganic polymer film 7 may be identically configured.

Figure 5C:
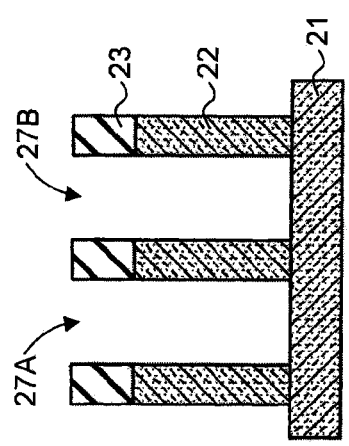

Next, as illustrated in FIG. 5C, the silicon-containing inorganic polymer film 25 is oxidized in a water-vapor-containing atmosphere, so that the silicon-containing inorganic polymer film 25 is converted into a silicon oxide film 26. This oxidation process is performed in the same manner as the oxidation process illustrated in FIG. 1E.

Figure 5D:
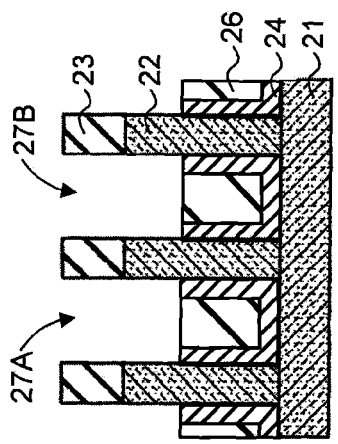

Next, as illustrated in FIG. 5D, the silicon oxide film 26 and the liner film 24 are thinned by a method such as CMP or the like until the CMP stopper film 23 is exposed, so that the silicon oxide film 26 and the liner film 24 on the fin 22 are removed.

Figure 5E:
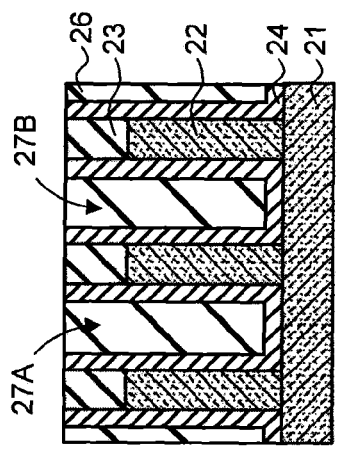

Next, as illustrated in FIG. 5E, upper portions of the silicon oxide film 26 and the liner film 24 are removed by dry etching using a fluoride or wet etching using a dilute hydrofluoric acid, so that a portion of the fin 22 protrudes from the top surface of the silicon oxide film 26 and the liner film 24. Thereafter, a gate electrode is formed on the side wall of the fin 22 with a gate insulating film being interposed between them, and thus a double gate-type transistor can be formed.

In this embodiment, the silicon-containing inorganic polymer film 25 is configured to contain an alkali metal element or an alkali earth metal element and as a result a reaction for converting the silicon-containing inorganic polymer film 25 into the silicon oxide film 26 can be promoted. Because of this, the silicon oxide film 26 may have the film quality, such as the concentration of an element, a density, or the like, which is close to that of the liner film 24 even while the temperature of the oxidation process of the silicon-containing inorganic polymer film 25 is lowered. Furthermore, the silicon oxide film 26 can be surely embedded in a gap between the fins 22 and etching resistance can be improved as well as the transformation of the semiconductor substrate 21 can be prevented.

Third Embodiment

FIGS. 6A to 6E are cross-sectional views illustrating a method of manufacturing a semiconductor device according to a third embodiment. In the third embodiment, a Pre Metal Dielectric (PMD) semiconductor device is described as an example.

Figure 6A:
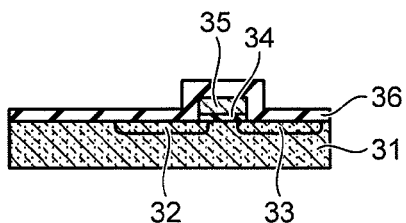
FIGS. 6A to 6E are cross-sectional views illustrating a method of manufacturing a semiconductor device according to a third embodiment.

In FIG. 6A, after a gate electrode 35 is formed on a semiconductor substrate 31 with a gate insulating film 34 interposed therebetween, impurity diffusion layers 32 and 33 are formed in the semiconductor substrate 31 to be located at both sides of the gate electrode 35. Subsequently, an inter-layer insulating film 36 is formed on the semiconductor substrate 31 by a method such as CVD or the like. In addition, as the inter-layer insulating film 36, a silicon oxide film can be used.

Figure 6B:
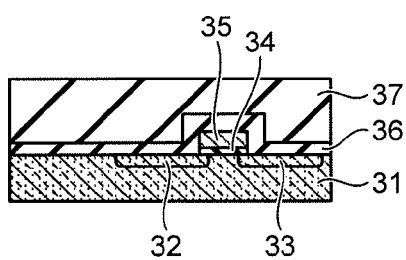

Subsequently, as illustrated in FIG. 6B, a silicon-containing inorganic polymer film 37 is formed on the inter-layer insulating film 36 by a method such as a coating method or the like in a manner such that the vicinity of the gate electrode 35 is planarized. In this case, the silicon-containing inorganic polymer film 37 is configured to contain an alkali metal element or an alkali earth metal element. This silicon-containing inorganic polymer film 37 may have the same configuration as the silicon-containing inorganic polymer film 7.

Figure 6C:
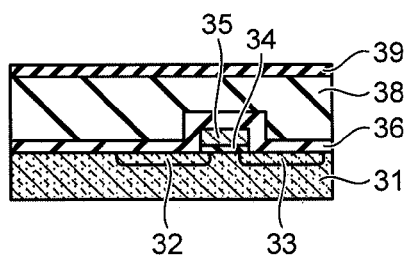

Subsequently, as illustrated in FIG. 6C, the silicon-containing inorganic polymer film 37 is oxidized in a water-vapor-containing atmosphere so that the silicon-containing inorganic polymer film 37 may be converted into a silicon oxide film 38. This oxidation process is similar to the oxidation process illustrated in FIG. 1E.

Subsequently, a CMP stopper film 39 is formed on the silicon oxide film 38 by a method such as CVD or the like. As the CMP stopper film 39, a silicon nitride film may be used, or alternatively a polycrystalline silicon film may be used. The thickness of the CMP stopper film 39 may be set to be in the range of, for example, 100 to 200 nm.

Figure 6D:
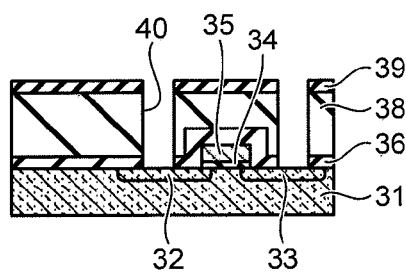

Subsequently, as illustrated in FIG. 6D, opening portions 40 through which the impurity diffusion layers 32 and 33 are exposed are formed in the CMP stopper film 39, the silicon oxide film 38 and the inter-layer insulating film 36, using photolithography technology and dry etching technology.

Figure 6E:
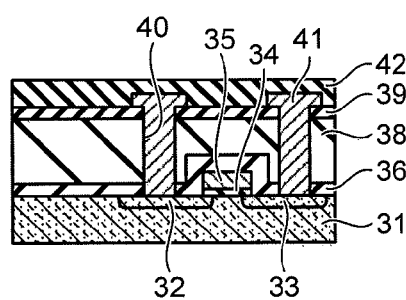

Subsequently, as illustrated in FIG. 6E, interconnects 41 connected to the impurity diffusion layers 32 and 33 are formed on the CMP stopper film 39 to be embedded in the opening portions 40. An inter-layer insulating film 42 is formed on the interconnects 41 by a method such as CVD or the like. As the interconnects 41, a metal such as Al, Cu, or the like may be used. As the inter-layer insulating film 42, a silicon oxide film may be used.

In this embodiment, the silicon-containing inorganic polymer film 37 may be configured to contain an alkali metal element or an alkali earth metal element to promote a reaction for converting the silicon-containing inorganic polymer film 37 into the silicon oxide film 38. Because of this configuration, not only it is possible to lower the temperature of the oxidation process of the silicon-containing inorganic polymer film 37 but also it is possible to enable the oxide film 38 to have the film quality, such as element concentration or density, which is close to that of the silicon dioxide. This configuration also allows the prevention of the transformation of the semiconductor substrate 31 and an improvement in the etching resistance of the silicon oxide film 38.

Fourth Embodiment

Figure 7A:
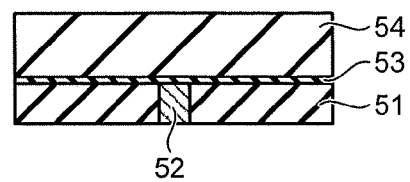
FIGS. 7A to 7C are cross-sectional views illustrating a method of manufacturing a semiconductor device according to a fourth embodiment.
Figure 7B:
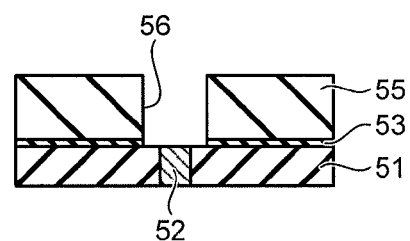
Figure 7C:
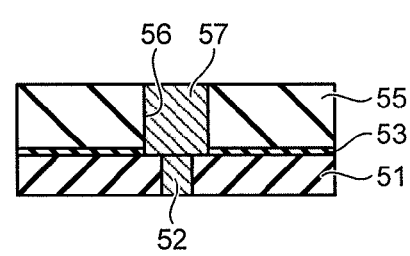

FIGS. 7A to 7C are cross-sectional views illustrating a method of manufacturing a semiconductor device according to a fourth embodiment. In the fourth embodiment, an Inter Metal Dielectric semiconductor device is described as an example.

In FIG. 7A, after interconnects 52 are embedded in an inter-layer insulating film 51, a protective film 53 is formed on the inter-layer insulating film 51 by a method such as CVD or the like. As the inter-layer insulating film 51, a silicon oxide film may be used. As the protective film 53, a silicon nitride film may be used. Next, a silicon-containing inorganic polymer film 54 is formed on the protective film 53 by a method such as a coating method or the like. In this case, the silicon-containing inorganic polymer film 54 is configured to contain an alkali metal element or an alkali earth metal element. This silicon-containing inorganic polymer film 54 may have the same configuration as the silicon-containing inorganic polymer film 7.

Subsequently, as illustrated in FIG. 7B, the silicon-containing inorganic polymer film 54 is oxidized in a water-vapor-containing atmosphere so that the silicon-containing inorganic polymer film 54 is converted into a silicon oxide film 55. This oxidation process may be similar to the oxidation process of FIG. 1E. Next, opening portions 56 through which the interconnects 52 are exposed are formed in the silicon oxide film 55 and the protective film 53 using photolithography technology and dry etching technology.

Subsequently, as illustrated in FIG. 7C, interconnects 57 connected to the interconnects 52 are embedded in the opening portions 56.

In this embodiment, since the silicon-containing inorganic polymer film 54 is configured to contain an alkali metal element or an alkali earth metal element, a reaction for converting the silicon-containing inorganic polymer film 54 to the silicon oxide film 55 can be promoted and furthermore the etching resistance of the silicon oxide film 55 can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a plurality of trenches formed in an element isolating area of the semiconductor substrate;
   a silicon oxide film that is embedded in each trench of the plurality of trenches and contains an alkali earth metal element; and
   a fin which is formed between the trenches of the plurality of trenches and has an upper portion uncovered by the silicon oxide film that is embedded in each trench of the plurality of trenches and contains an alkali earth metal element and is thus exposed.

2. The semiconductor device according to claim 1, wherein the alkali earth metal element is selected from the group consisting of Mg and Sr.

3. The semiconductor device according to claim 1, wherein a concentration of the alkali earth metal element is set to $10^{10}$ atoms/cm$^2$ or higher in terms of a surface concentration of an oxide which is formed into a film on the semiconductor substrate.

4. The semiconductor device according to claim 1, wherein the alkali earth metal element is an element whose both activation energies for moving a univalent ion and a neutral atom in a silicon lattice are 1.5 eV or larger.

5. The semiconductor device according to claim 1, further comprising:
   a liner film which is formed between the trench and the silicon oxide film that is embedded in the trench and contains neither an alkali metal element nor an alkali earth metal element.

6. The semiconductor device according to claim 5, wherein the silicon oxide film that is embedded in the trench and the liner film are equal in height to each other.

7. A method of manufacturing a semiconductor device, the method comprising: forming a trench plurality of trenches in an element isolating area in a semiconductor substrate to form a fin between the trenches of the plurality of trenches; embedding a silicon-containing inorganic polymer film in each trench of the plurality of trenches, the silicon-containing inorganic polymer film containing an alkali earth metal element and not covering an upper portion of the fin; and converting the silicon-containing inorganic polymer film into a silicon oxide film by thermal-treating the silicon-containing inorganic polymer film.

8. The method of manufacturing a semiconductor device according to claim 7,
   wherein the silicon-containing inorganic polymer film is made of a polymer having a Si—O bond or a Si—N bond as a basic structure.

9. The method of manufacturing a semiconductor device according to claim 7,
   wherein the silicon-containing inorganic polymer film is a perhydropolysilazane (PHPS) film or a hydrogen silsesquioxane (HSQ) film.

10. The method of manufacturing a semiconductor device according to claim 7, wherein the alkali metal element or the alkali earth metal element is selected from the group consisting of Mg and Sr.

11. The method of manufacturing a semiconductor device according to claim 7, wherein a concentration of the alkali earth metal element is $10^{10}$ atoms/cm$^2$ or higher in terms of a surface concentration of an oxide which is formed into a film on the semiconductor substrate.

12. The method of manufacturing a semiconductor device according to claim 7, wherein the alkali earth metal element is an element whose both activation energies for moving a univalent ion and a neutral atom respectively in a silicon lattice are 1.5 eV or higher.

13. The method of manufacturing a semiconductor device according to claim 7, further comprising: forming a liner on a side wall of the trench, the liner film containing neither an alkali metal element nor an alkali earth metal element.

14. The method of manufacturing a semiconductor device according to claim 7, further comprising:
   thermal-treating the silicon oxide film at a temperature which is equal to or higher than 700° C. and is equal to or lower than 1100° C. in an inert gas atmosphere.

15. The method of manufacturing a semiconductor device according to claim 7, further comprising: stacking a gate insulating film and a floating gate electrode film on the semiconductor substrate before the forming of the trenches in the semiconductor substrate.

16. The method of manufacturing a semiconductor device according to claim 15, further comprising: sequentially forming an inter-electrode insulating film and a control gate electrode film on the floating gate electrode after the forming of the silicon oxide film embedded in the trenches.

* * * * *